United States Patent [19]

Date et al.

[11] Patent Number: 5,459,350
[45] Date of Patent: Oct. 17, 1995

[54] RESIN SEALED TYPE SEMICONDUCTOR DEVICE

[75] Inventors: Shoji Date, Kawanishi; Ziro Honda, Itami; Toshiya Nakano, Itami; Hazime Kato, Itami, all of Japan

[73] Assignee: Mitsubishi Denki Kabushiki Kaisha, Tokyo, Japan

[21] Appl. No.: 318,447

[22] Filed: Oct. 5, 1994

Related U.S. Application Data

[63] Continuation of Ser. No. 180,344, Jan. 12, 1994, abandoned.

[30] Foreign Application Priority Data

Jan. 13, 1993 [JP] Japan .......................................... 5-4199

[51] Int. Cl.⁶ ...................................................... H01L 23/16
[52] U.S. Cl. ............................ 257/666; 257/692; 257/724
[58] Field of Search ...................................... 257/666, 692, 257/528, 530, 724

[56] References Cited

U.S. PATENT DOCUMENTS

| 5,173,762 | 12/1992 | Ota et al. ................................ 257/666 |
| 5,229,640 | 7/1993 | Pak ........................................... 257/666 |
| 5,287,083 | 2/1994 | Person et al. ............................ 338/332 |

FOREIGN PATENT DOCUMENTS

| 63-15435 | 1/1988 | Japan . |
| 2-238655 | 9/1990 | Japan . |

Primary Examiner—William Mintel
Assistant Examiner—Roy Potter
Attorney, Agent, or Firm—Leydig, Voit & Mayer

[57] ABSTRACT

A resin sealed semiconductor device includes a current-detecting resistance for detecting current flowing in a semiconductor element that is a metallic resistance having a coefficient of thermal expansion almost equal to that of the lead frame. Compared to a conventional ceramic chip resistance, its coefficient of thermal expansion differs less from that of the lead frame, thereby preventing deterioration caused by heat stress.

2 Claims, 6 Drawing Sheets

RESIN SEALED TYPE SEMICONDUCTOR DEVICE

This disclosure is a continuation application of U.S. patent application Ser. No. 08/180,344, filed Jan. 12, 1994, now abandoned.

BACKGROUND OF THE INVENTION

1. Field of the Invention

The present invention relates to a resin sealed semiconductor device, more particularly, to a resin sealed semiconductor device used for such devices as lighting system devices for vehicles.

2. Description of the Related Arts

FIG. 9 is a schematic plan view of a conventional resin sealed semiconductor device. FIG. 10 is a transparent perspective diagram thereof. Referring to these figures, onto a lead frame 1 are mounted a semiconductor element and a controlling semiconductor element 3, which element 3 is an integrated circuit for controlling the semiconductor element 2. The lead frame 1 is, for example, nickel plated onto a copper base material. In addition, between leads 1a and 1b is a ceramic chip resistance 15, which is a current-detecting resistance, fixed by solder 20, as shown in FIG. 11. The ceramic chip resistance 15 has, for example, silver, palladium and other conductor electrodes on the surface of an alumina plate. The emitter electrode 14 of the semiconductor element 2, the controlling semiconductor element 3 and the ceramic chip resistance 15, are electrically connected by means of the lead 1a.

The semiconductor element 2 has its base electrode 16 electrically connected to an external input electrode 10 by means of a lead 1c. The front end of leads 1d, 1b, and 1c serve respectively as an external output electrode 8, an external ground electrode 9, and an external input electrode 10, and are connected to an external circuit which is not illustrated. The emitter electrode 14 of the semiconductor element 2 is electrically connected to the lead 1a by a thin metallic wire 5 such as an aluminum wire, while the controlling semiconductor element 3 is electrically connected to the leads 1a, 1b, 1c, and the like by thin metallic wires 6 such as gold wire. As illustrated in FIG. 9, the semiconductor element 2, the lead frame 1, and the like are encapsulated with a molded resin 7, excluding the external output electrode 8, external ground electrode 9, and external input electrode 10. In FIG. 8, the molded resin 7 is not illustrated.

The conventional resin sealed semiconductor devices have the above-described structure. An equivalent circuit of the resin sealed semiconductor device shown in FIG. 9 is illustrated in FIG. 12. Referring to the figure, a pulse signal is input from an external circuit (not shown) to the external input electrode, and the semiconductor element 2 is driven. At this time, when the pulse input signal is in a high state, current which flows in the ceramic chip resistance 15 is detected, so that current in excess of a predetermined amount does not flow in the semiconductor 2. The controlling semiconductor device 3 operates to control the current which flows in the semiconductor element 2 at a constant level.

As described above, in the resin sealed semiconductor device, the ceramic chip resistance 15 has been soldered to the leads 1a and 1b. This has given rise to problems such as variations in resistance values depending on the amount of solder used, and changes in resistance values caused by fatigue of the solder across the ceramic chip resistance 15 when an endurance test was carried out for a long period of time. There have been additional problems such as large differences in the coefficient of thermal expansion between the ceramic chip resistance 15 and the leads 1a and 1b, and the apparatus's weakness to heat stress, producing, during operation, deformations which crack the solder. Further, when the ceramic chip resistance 15 had a low resistance, for example 30 mΩ, its precision dropped, reducing yield and increasing costs.

SUMMARY OF THE INVENTION

The present invention intends to solve such problems by providing a highly reliable and inexpensive resin sealed semiconductor device having a current detecting resistance preventing heat stress and having a resistance value that does not change.

According to the invention, there is provided a resin sealed semiconductor device comprising a lead frame, a semiconductor element mounted on a die pad of the lead frame, a controlling semiconductor element for controlling the semiconductor element mounted on the die pad, a current-detecting resistance for detecting current flowing in the semiconductor element mounted on the lead frame; and a sealing resin encapsulating the lead frame, the semiconductor element, the controlling semiconductor element, and the current-detecting resistance, wherein the current-detecting resistance is a metallic chip resistance having a coefficient of thermal expansion almost equal to that of the lead frame.

DESCRIPTION OF THE PREFERRED EMBODIMENTS

Embodiment 1

Figure 1:
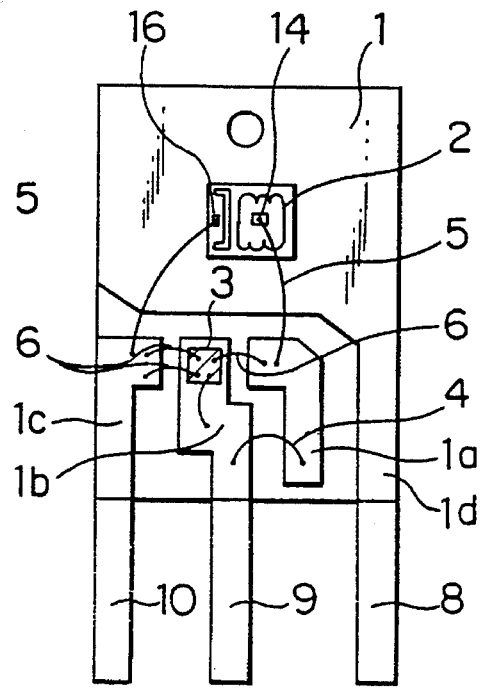
FIG. 1 is a schematic plan view of a resin sealed semiconductor device in accordance with a first embodiment of the intention.

FIG. 1 is a schematic plan view of a resin sealed semiconductor device in accordance with a first embodiment of the invention. In each of the figures, the same reference numerals designate like or corresponding parts. In FIGS. 1 through 5 and 7 and 8, the molded resin 7 is not illustrated.

Figure 12:
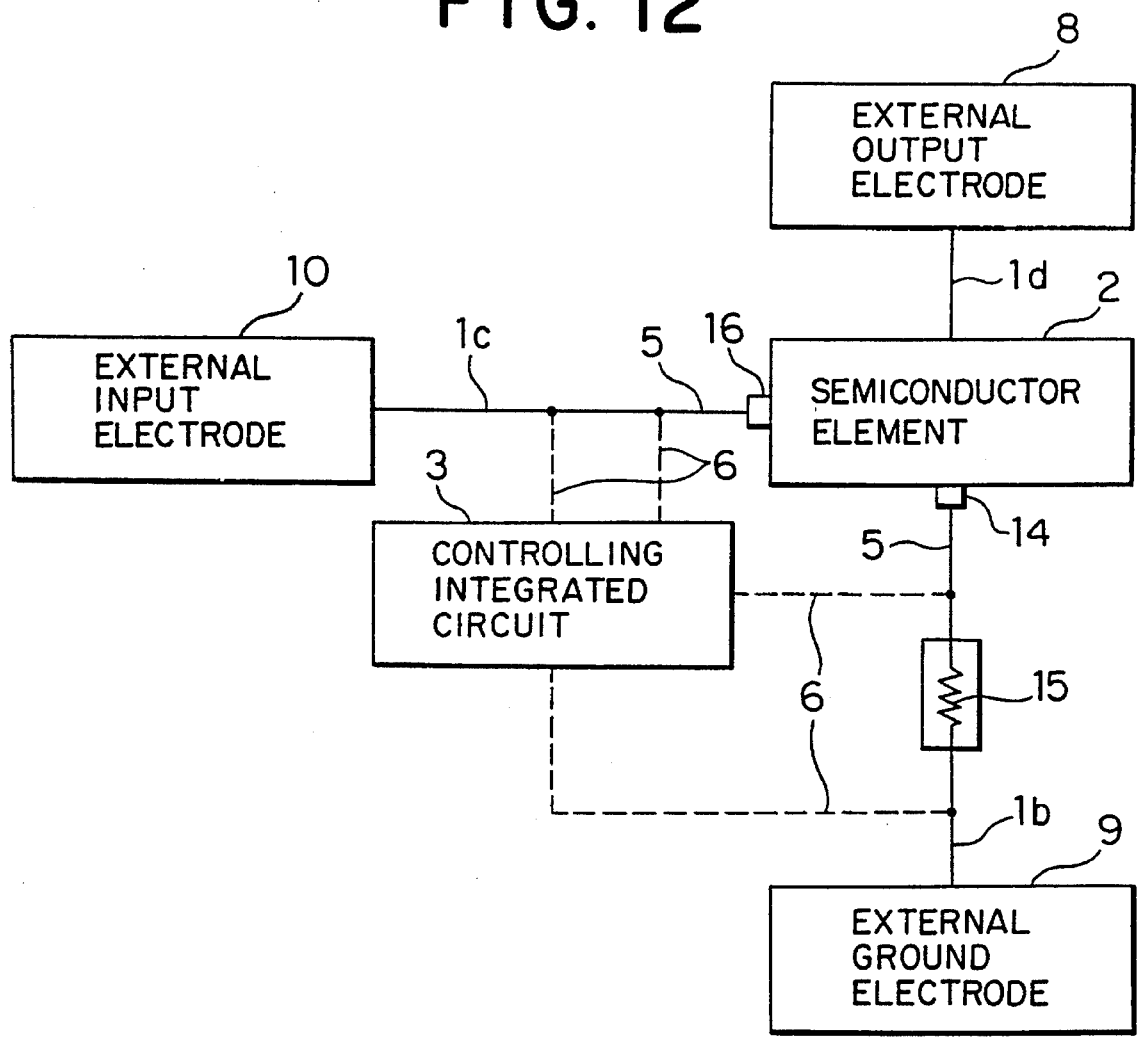
FIG. 12 is a schematic structural view of an equivalent circuit of a resin sealed semiconductor device.

Referring to FIG. 1, between leads 1a and 1b is provided as a current-detecting resistance a flexible metallic wire resistance 4, for example a copper-nickel metallic wire having a coefficient of thermal expansion almost equal to those of leads 1a and 1b. The wire is connected thereto, for example, by applied pressure. The equivalent circuit of the resin sealed type semiconductor device, illustrated in FIG. 12, may be applied in the same way to each of the embodiments of the invention. Here, a ceramic chip resistance 15 is replaced by a metallic wire resistance 4, a metallic chip resistance 12, a lead frame resistance 13, and the like.

In the resin sealed semiconductor device having the above-described structure, changes in resistance values caused by the use of solder in the conventional device do not occur because the current-detecting resistance is formed by the metallic wire resistance 4 which is connected by applied pressure. In addition, since the metallic wire resistance 4 has about the same coefficient of thermal expansion as the leads 1a and 1b, and is flexible, thermal stress caused by differences in the coefficients of thermal expansion of the leads 1a and 1b with the resistance 4 does not occur. Consequently, deterioration can be prevented, so that a highly reliable and inexpensive resin sealed semiconductor device is obtained.

In the foregoing description, although a copper-nickel metallic wire resistance 4 was used, a copper or iron-nickel metallic wire may also be used in the same way. In addition, although only one metallic wire resistance 4 was used, more than one wire may also be used, or the wire may be wound into a coil for obtaining the desired resistance value.

Figure 2:
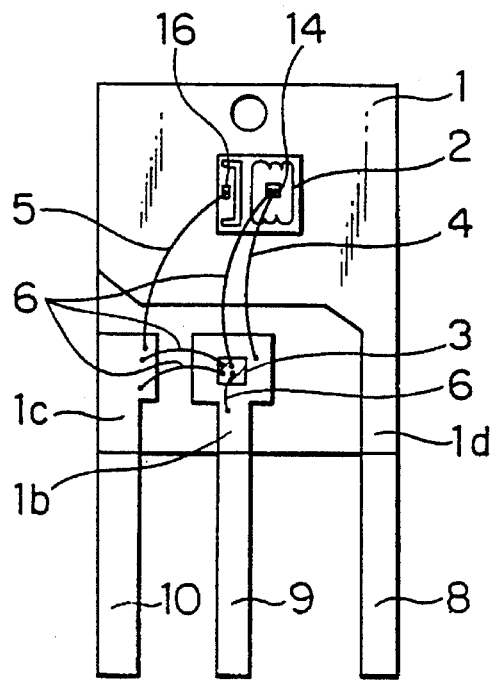
FIG. 2 is a schematic plan view of the resin sealed semiconductor device in accordance with a modification of the first embodiment of the invention.

Further, as shown in FIG. 2, the metallic wire resistance 4, which serves as a current-detecting resistance, may be mounted directly between the emitter electrode 14 of the semiconductor element 2 and the external ground electrode 9, with the same effects obtained as those described above.

Embodiment 2

Figure 3:
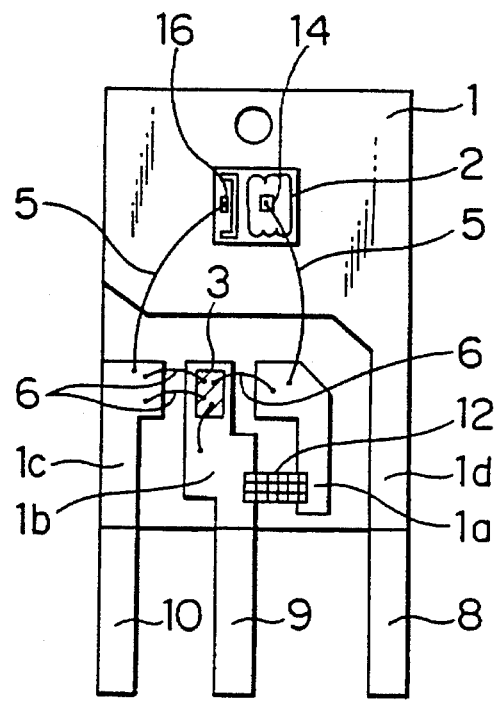
FIG. 3 is a schematic plan view of a resin sealed semiconductor device in accordance with a second embodiment of the invention.

FIG. 3 is a schematic plan view showing a resin sealed semiconductor device in accordance with a second embodiment of the invention. Referring to the figure, between the leads 1a and 1b is soldered a copper-nickel metallic chip resistance 12, which serves as a current-detecting resistance, having about the same coefficient of thermal expansion as the leads 1a and 1b. Compared to the conventional ceramic chip resistance 15, there is a smaller difference in the coefficient of thermal expansion between the leads 1a and 1b and the metallic chip resistance 12, so that deterioration caused by heat stress can be prevented, providing an inexpensive resin sealed semiconductor device having increased reliability.

In the foregoing description, the metallic chip resistance 12, formed by a copper-nickel alloy, may be formed by an iron-nickel alloy, with the same effects obtained as those described above.

Embodiment 3

Figure 4:
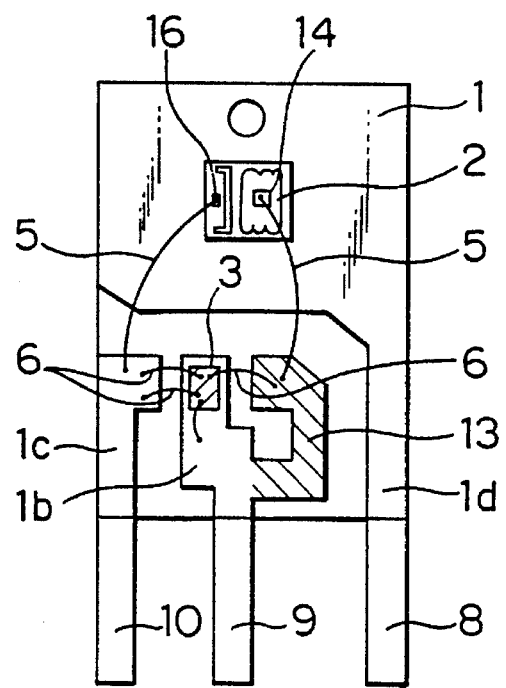
FIG. 4 is a schematic plan view of a resin sealed semiconductor device in accordance with a third embodiment of the invention.

FIG. 4 is a schematic plan view illustrating a resin sealed semiconductor device in accordance with a third embodiment of the invention. In the present embodiment, as a current-detecting resistance a lead frame resistance 13 is formed using a lead, itself, having nickel plated onto a copper base material. The lead frame resistance 13 can be integrally formed by punching the lead frame 1 at the same time as when it is being formed. As a result, the difference in its coefficient of thermal expansion from that of the lead 1b disappears, preventing deterioration caused by heat stress from occurring. Consequently, an inexpensive resin sealed semiconductor device with increased reliability is produced. In addition, since the lead frame resistance 13 is formed by pressing and punching, dimensional stability and increased precision in resistance values can be obtained.

In the foregoing description, although the lead frame, itself, having a copper base material plated with nickel was made the lead frame resistance 13, a lead frame having an iron-nickel base material plated with nickel may also be made the lead frame resistance 13, with the same effects obtained as those described above.

Embodiment 4

Figure 5:
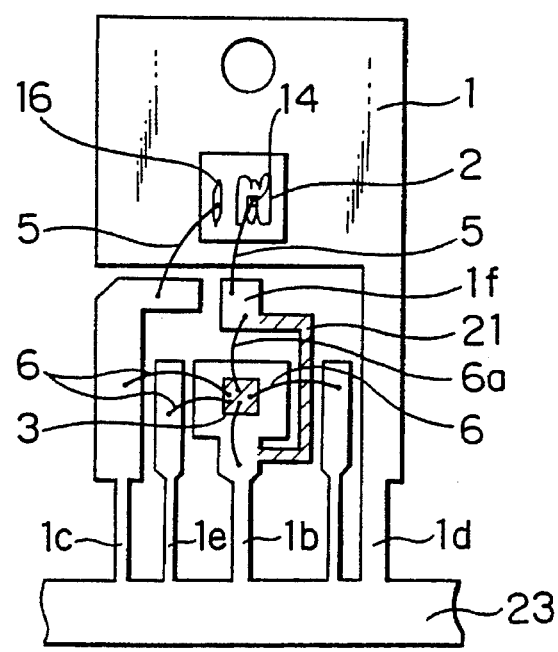
FIG. 5 is a schematic plan view of a resin sealed semiconductor device in accordance with a fourth embodiment of the invention.

FIG. 5 is a schematic plan view of a resin sealed semiconductor device in accordance with a fourth embodiment of 0 the invention. In the embodiment, a lead frame resistance 21 is provided between the lead 1b and an island 1f, with the lead frame resistance 21 plated with silver formed in a stripe pattern. By appropriately changing the bonding location of the thin metallic wire 6 on the island, 1f, a wide range of resistance values can be selected.

Figure 6:
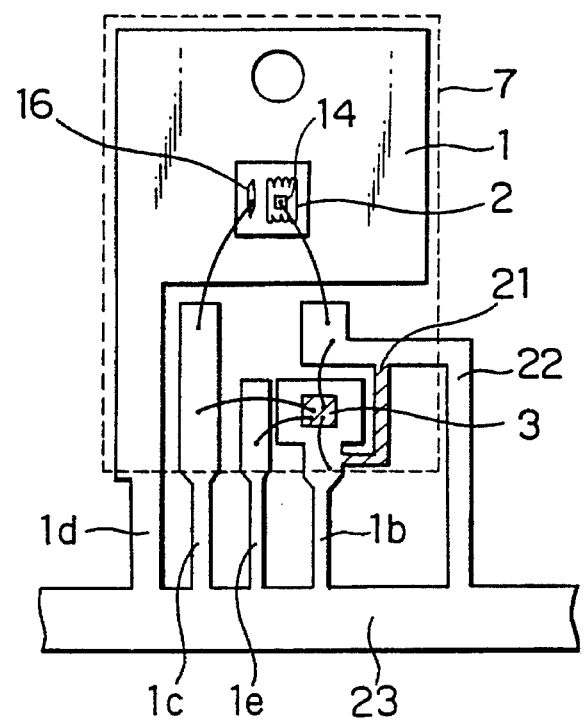
FIG. 6 is a schematic plan view of the resin sealed semiconductor device in accordance with a modification of the fourth embodiment of the invention.

The resistance value of the lead frame resistance 21 must be made, for example about 10 mΩ, so that its width must be made thin enough to allow its resistance to range from 0.1 mm to 0.8 mm. In order not to deform the lead frame resistance 21, during assembly, an auxiliary lead pin 22 may be provided, as shown in FIG. 6. The auxiliary lead pin 22, which protrudes from the side portion of the molded resin 7, is connected to a tie bar 23 of the lead frame 1. The auxiliary lead pin 22 is cut at the same time as the tie bar 23 is cut.

Embodiment 5

Figure 7:
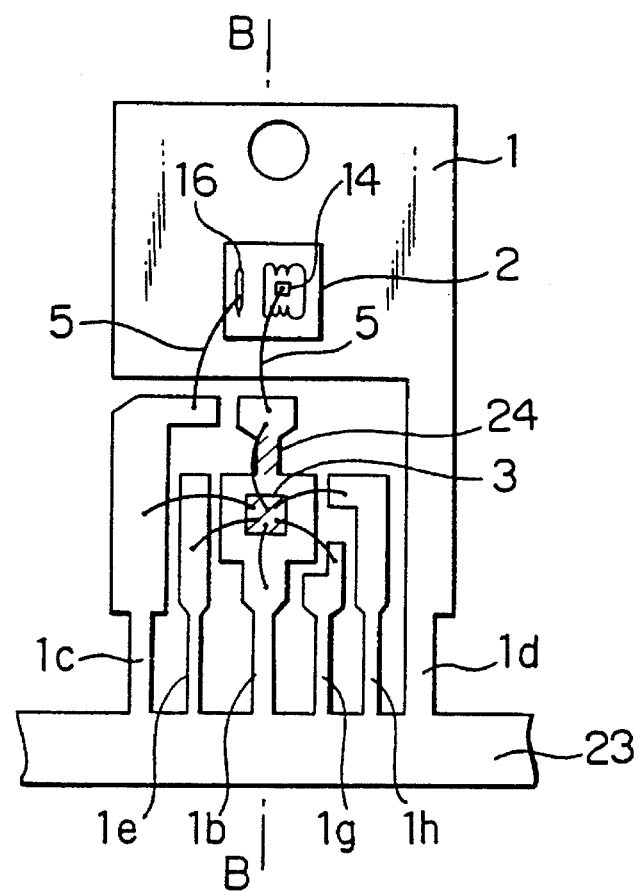
FIG. 7 is a schematic plan view of a resin sealed semiconductor device in accordance with a fifth embodiment of the invention.
Figure 8:
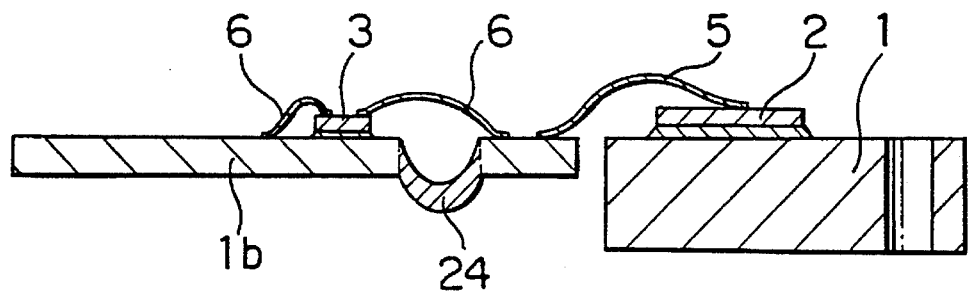
FIG. 8 is a cross section taken on line B—B of FIG. 7.
Figure 9:
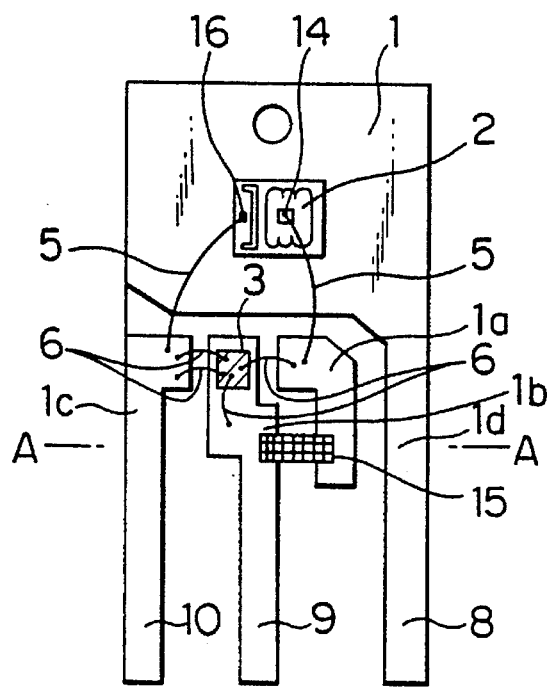
FIG. 9 is a schematic plan view of a conventional resin sealed semiconductor device.
Figure 10:
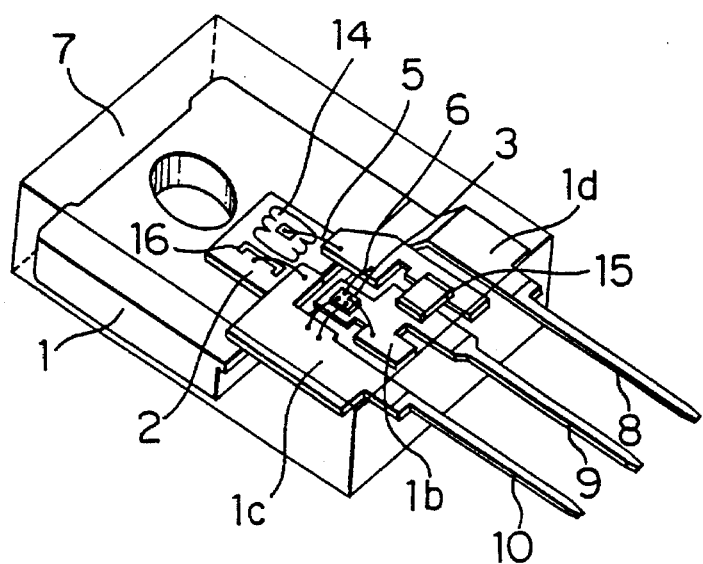
FIG. 10 is a perspective view of the conventional resin sealed type semiconductor device.
Figure 11:
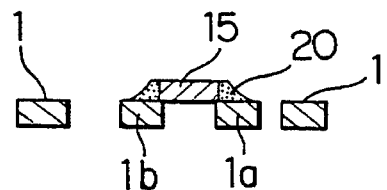
FIG. 11 is a sectional view taken along line A—A of FIG. 9.

FIG. 7 is a schematic plan view showing a resin sealed semiconductor device in accordance with a fifth embodiment of the invention. FIG. 8 is a side sectional view taken along line B—B. In the embodiment, the lead frame, itself, is used to form the lead frame resistance 24, with the lead frame resistance 24 having a curved section. The lead frame resistance 24 may be formed by punching the planar lead frame 1 and then by bending it. Forming a curved section in the lead frame resistance 24 allows the current-detecting resistance to be formed using a smaller area as compared to when it is formed without a curved section, thereby reducing the size of the resin sealed semiconductor device as well as increasing the number of lead pins.

As described above, a highly reliable and inexpensive resin sealed semiconductor device is produced. Deterioration caused by heat stress resulting from a difference in resistance between the metallic chip resistance and the leads can be prevented; changes in resistance values do not occur; and the difference in the coefficient of thermal expansion between the resistance and the lead frame can be absorbed, thereby preventing deterioration caused by heat stress. In addition, since the current-detecting resistance can be formed using a smaller area as compared to when it is formed without a curved section, the resin sealed semiconductor device can be reduced in size, and the number of lead pins increased.

What is claimed is:

1. A resin sealed semiconductor device comprising:

a lead frame including a die pad and leads and having a coefficient of thermal expansion;

a semiconductor element mounted on said die pad;

a controlling semiconductor element for controlling said semiconductor element mounted on said lead frame;

a current-detecting resistance for detecting current flowing in said semiconductor element, said current-detecting resistance being mounted on said leads; and a sealing resin encapsulating said lead frame, said semiconductor element, said controlling semiconductor element, and said current-detecting resistance wherein said current-detecting resistance portion of a lead of said lead frame.

2. The device of claim 1 wherein said portion of a lead of said lead frame has a concave section.

* * * * *

UNITED STATES PATENT AND TRADEMARK OFFICE
CERTIFICATE OF CORRECTION

PATENT NO. : 5,459,350
DATED : October 17, 1995
INVENTOR(S) : Date et al.

It is certified that error appears in the above-indentified patent and that said Letters Patent is hereby corrected as shown below:

Column 6, Line 5, after "resistance" insert

--comprises a--;

Signed and Sealed this

Fourteenth Day of May, 1996

Attest:

BRUCE LEHMAN

Attesting Officer

Commissioner of Patents and Trademarks